United States Patent
Kasai et al.

(10) Patent No.: US 7,683,473 B2
(45) Date of Patent: Mar. 23, 2010

(54) SEMICONDUCTOR DEVICE, FABRICATION METHOD THEREFOR, AND FILM FABRICATION METHOD

(75) Inventors: Junichi Kasai, Kanagawa (JP); Kouichi Meguro, Tokyo (JP); Masanori Onodera, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 157 days.

(21) Appl. No.: 11/540,034

(22) Filed: Sep. 28, 2006

(65) Prior Publication Data
US 2007/0105304 A1 May 10, 2007

Related U.S. Application Data

(63) Continuation-in-part of application No. PCT/JP2005/017816, filed on Sep. 28, 2005.

(51) Int. Cl.
  H01L 23/04 (2006.01)
  H01L 21/30 (2006.01)
(52) U.S. Cl. ............... 257/698; 257/734; 257/E23.067; 257/E23.151; 257/E21.627; 438/455; 438/618
(58) Field of Classification Search ............. 438/455, 438/618, 622; 257/678, 686, 698, 734, 774
  See application file for complete search history.

(56) References Cited

U.S. PATENT DOCUMENTS

| | | | |
|---|---|---|---|
| 6,433,412 B2 * | 8/2002 | Ando et al. ............. | 257/678 |
| 7,267,559 B2 * | 9/2007 | Hashitani et al. ........ | 439/91 |
| 7,501,584 B2 * | 3/2009 | Hashimoto et al. ....... | 174/259 |
| 2003/0067043 A1 * | 4/2003 | Zhang ................. | 257/390 |
| 2005/0288427 A1 * | 12/2005 | Jeon et al. ............ | 524/555 |
| 2006/0155914 A1 * | 7/2006 | Jobs et al. ............ | 711/100 |
| 2006/0238347 A1 * | 10/2006 | Parkinson et al. ....... | 340/572.4 |
| 2007/0059503 A1 * | 3/2007 | Park et al. ............ | 428/209 |
| 2007/0159335 A1 * | 7/2007 | Arai et al. ............ | 340/572.8 |

FOREIGN PATENT DOCUMENTS

| | | |
|---|---|---|
| JP | 2000012626 | 1/2000 |
| JP | 2000129218 | 5/2000 |
| JP | 2004055770 | 2/2004 |
| WO | WO 2005109447 A1 * | 11/2005 |

* cited by examiner

*Primary Examiner*—Hsien-ming Lee

(57) ABSTRACT

The present invention provides a semiconductor device, a fabrication method therefor, and a film fabrication method, the semiconductor device including a first substrate (e.g., a semiconductor chip), an anisotropic conductive film that is provided on the first substrate and has a wiring pattern having at least a portion providing conduction through the anisotropic conductive film, and a second substrate (semiconductor chip) provided on the anisotropic conductive film and coupled to the first substrate via the portion providing conduction through the anisotropic conductive film. According to the present invention, it is possible to provide a semiconductor device, a fabrication method therefor, and a film fabrication method, by which production costs can be reduced in electrically coupling different positions in upper and lower substrates.

29 Claims, 14 Drawing Sheets

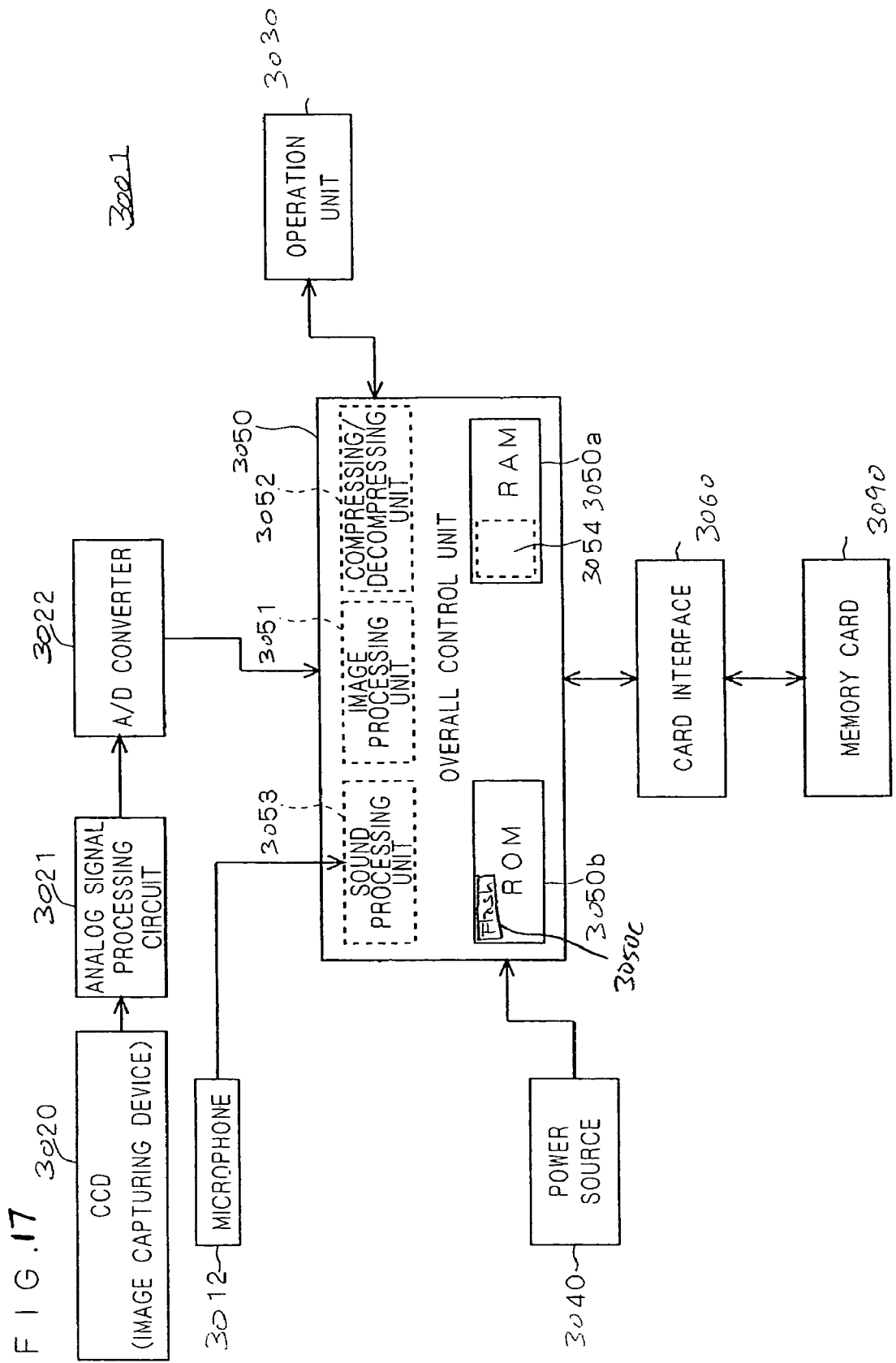

SEMICONDUCTOR DEVICE, FABRICATION METHOD THEREFOR, AND FILM FABRICATION METHOD

CROSS-REFERENCES TO RELATED APPLICATIONS

This is a continuation in part of International Application No. PCT/JP2005/017816, filed Sep. 28, 2005 which was not published in English under PCT Article 21(2).

TECHNICAL FIELD

This invention relates generally to semiconductors, fabrication methods therefor, and film fabrication methods, and more particularly, to a semiconductor device having an anisotropic conductive film with a wiring pattern, a fabrication method therefor, and a film fabrication method.

BACKGROUND

In recent years, the semiconductor devices used in portable electronics devices such as mobile telephones or non-volatile memory media such as IC memory cards are demanded to reduce the sizes thereof. To this end, there have been employed packaging methods of stacking an interposer or semiconductor substrates (semiconductor chips).

BRIEF DESCRIPTION OF THE DRAWINGS

FIG. 17 illustrates an exemplary digital camera, in accordance with an embodiment of the present claimed subject matter.

DETAILED DESCRIPTION

Reference will now be made in detail to embodiments of the present claimed subject matter, examples of which are illustrated in the accompanying drawings. While the claimed subject matter will be described in conjunction with these embodiments, it will be understood that they are not intended to limit the claimed subject matter to these embodiments. On the contrary, the claimed subject matter is intended to cover alternatives, modifications and equivalents, which may be included within the spirit and scope of the claimed subject matter as defined by the appended claims. Furthermore, in the following detailed description of the present claimed subject matter, numerous specific details are set forth in order to provide a thorough understanding of the present claimed subject matter. However, it will be evident to one of ordinary skill in the art that the present claimed subject matter may be practiced without these specific details. In other instances, well known methods, procedures, components, and circuits have not been described in detail as not to unnecessarily obscure aspects of the claimed subject matter.

Overview

In recent years, the semiconductor devices used in portable electronics devices such as mobile telephones or non-volatile memory media such as IC memory cards are demanded to reduce the sizes thereof. To this end, there have been employed packaging methods of stacking an interposer or semiconductor substrates (semiconductor chips).

Figure 1:
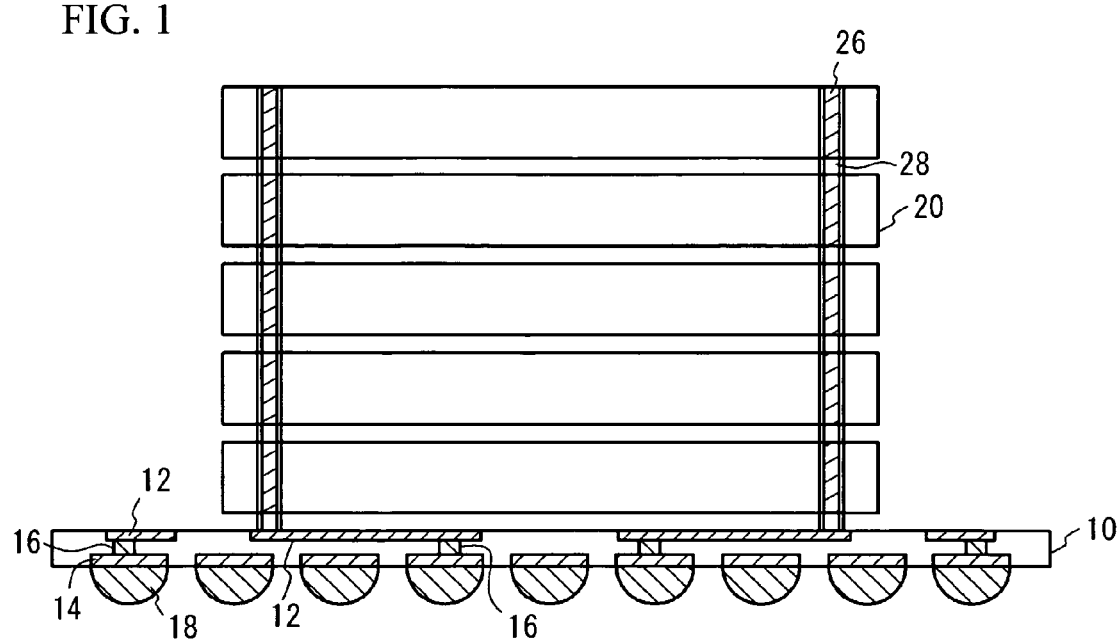
FIG. 1 is a cross-sectional view of a semiconductor device in accordance with a first embodiment of the present invention.

As an example thereof, a cross-sectional view of example 1 is shown in FIG. 1, in which multiple semiconductor chips are stacked on the interposer. Solder balls 18 are arranged at electrodes 14 provided on one surface of an interposer 10. Semiconductor chips 20 are located on the opposite surface of the solder balls 18. Via holes 26 in which a conductor is embedded are provided in the semiconductor chips 20, and upper and lower semiconductor chips 20 are connected by bumps 28. In an example shown in FIG. 1, the bumps 28 are arranged in contact with the via holes 26. As described, such stacked semiconductor chips 20 are electrically coupled to wiring electrodes 12 in the interposer 10 by the via holes 26 and the bumps 28. The wiring electrodes 12 are coupled to the electrodes 14 by connecting holes 16 that run through the interposer 10. In this manner, the semiconductor chips 20 are electrically coupled to the solder balls 18.

As in the above-described example 1, in a case where the upper and lower semiconductor chips 20 are coupled by means of the bumps 28, the via holes 26 at vertically same positions are coupled in the respective upper and lower semiconductor chips 20. In order to couple the via holes 26 at different positions in the upper and lower semiconductor chips 20, another wiring layer is added to the semiconductor chip 20 as a rewiring pattern layer (example 2). Alternatively, a printed circuit board having a wiring pattern is provided between the semiconductor chips 20. In this manner, the via holes 26 at different positions are coupled in the upper and lower semiconductor chips 20 (example 3).

Meanwhile, as in the example 1, in order to couple the upper and lower semiconductor chips 20 or the semiconductor chip 20 and the interposer 10 by using the bumps 28, there is a case where an anisotropic film is provided arranged the semiconductor chips 20 or between the semiconductor chip 20 and the interposer 10 (example 4). In Japanese Patent Application Publication No. 2002-368189 and Japanese Patent No. 2,919,976, there are disclosed semiconductor devices, in which an anisotropic conductive film is arranged between the semiconductor chip and the interposer. The anisotropic conductive film is a film having conductive particles included in the base substance made of an insulating film of, for example, an epoxy resin or the like. The anisotropic conductive film is an insulating film, but if pressure is applied, the conductive particles are brought into contact and provide conductivity. Therefore, if the pressure is applied to the anisotropic conductive film arranged between the bumps 28 and the semiconductor chips 20, corresponding portions of the anisotropic conductive film provide conductivity, thereby allowing the upper and lower semiconductor chips 20 to be electrically coupled.

In addition, in Japanese Patent Application Publication No. 2001-291721, there is disclosed a method of forming wiring patterns, by which the anisotropic conductive film is exposed to a laser beam to expose the conductive particles and the metal is selectively grown in the electroless plating method (example 5).

When the upper and lower substrates (for example, the semiconductor chips 20 in FIG. 2) are stacked as described, the methods of the example 2 or 3 can be thought to electrically couple vertically different positions in the upper and lower substrates. In the example 2, however, photolithography, sputtering, plating, and the like are performed to form the rewiring pattern layer on the semiconductor chips. For this reason, the production costs of the semiconductor chips are increased. In the example 3, glass epoxy substrate or polyimide substrate is used as a printed circuit board, although the afore-described substrates are expensive and the production costs are increased. In addition, as to the rewiring pattern and the printed circuit board, the mask has to be produced every time the wiring pattern is changed. Accordingly, the design flexibility is low.

In the example 4, since positions in the anisotropic conductive film to which the pressure is applied provide conductivity, different positions cannot be electrically coupled in the upper and lower substrates. In the example 5, the electroless plating method is employed because sufficient current necessary for electrolytic plating cannot be supplied. However, the film formation speed is low in the electroless plating method, and production costs become higher to form the wiring pattern of several tens of μm, for example, as a practical thickness.

The present invention has been made of the above circumstances and provides a semiconductor device, in which the production cost can be lowered in electrically coupling different positions in upper and lower substrates, a fabrication method therefor, and a film fabrication method.

According to a first aspect of the present invention, there is preferably provided a semiconductor device including: a first substrate; an anisotropic conductive film that is provided on the first substrate and has a wiring pattern having at least a portion providing conduction through the anisotropic conductive film; and a second substrate provided on the anisotropic conductive film and coupled to the first substrate via the portion providing conduction through the anisotropic conductive film. The anisotropic conductive film having the wiring pattern therein is coupled to the first substrate and the second substrate, thereby making it possible to provide the semiconductor device in which the production costs are low.

According to a second aspect of the present invention, there is preferably provided a method of fabricating a semiconductor device including: providing, on a first substrate, an anisotropic conductive film having a wiring pattern having at least a portion providing conduction through the anisotropic conductive film; and providing, on the anisotropic conductive film, a second substrate coupled to the first substrate via the portion providing conduction through the anisotropic conductive film. It is possible to provide a fabrication method of the semiconductor device at low production costs, by coupling the first substrate and the second substrate with the use of the anisotropic conductive film having the wiring pattern therein.

According to a third aspect of the present invention, there is preferably provided a method of fabricating a film including exposing an anisotropic conductive film to a laser beam so that a wiring pattern is formed in a region exposed thereto, the wiring pattern having at least a portion providing conduction through the anisotropic conductive film. It is possible to provide a film fabrication method at low production costs, by forming the wiring pattern in the laser exposure.

First Embodiment

Figure 2:
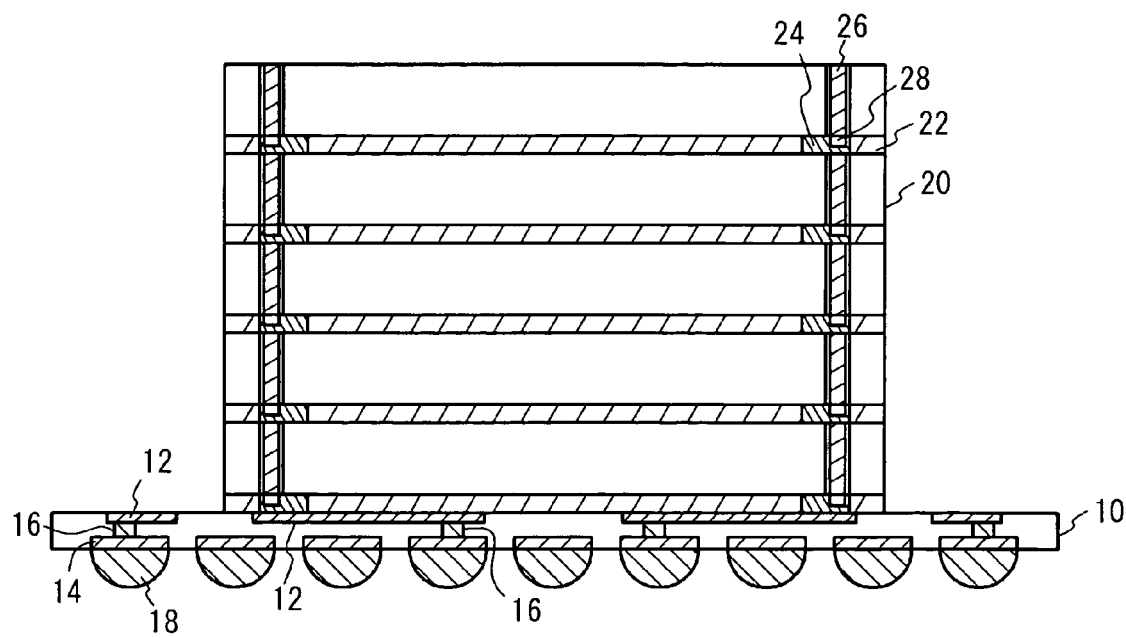
FIG. 2 is a cross-sectional view of the semiconductor device in accordance with the first embodiment of the present invention.

A first embodiment of the present invention is an example of a semiconductor device, in which semiconductor chips are stacked on an interposer. FIG. 2 is a cross-sectional view of the semiconductor device in accordance with the first embodiment of the present invention. Solder balls 18 are provided at electrodes 14 arranged on one surface of an interposer 10. Semiconductor chips 20 are stacked on the opposite surface of the solder balls 18, via holes 26, in which a conductive substance is embedded, are provided in the semiconductor chips 20, and bumps 28 are arranged in contact with the via holes 26. Anisotropic conductive films 22 that respectively have one or more wiring patterns 24 are provided between the semiconductor chips 20 and between the interposer 10 and the semiconductor chip 20. The bumps 28 for the upper semiconductor chips 20 are in contact with the wiring patterns 24 of the anisotropic conductive films 22, so the bumps 28 are electrically coupled to the wiring patterns 24. The wiring patterns 24 are in contact with the via holes 26 of the lower semiconductor chips 20, so the wiring patterns 24 are electrically coupled to the via holes 26 of the lower semiconductor chips 20. The lowest semiconductor chip 20 is coupled to wiring electrodes 12 in the interposer 10, in a similar manner. The wiring electrodes 12 and the electrodes 14 are connected by connecting holes 16. As described heretofore, each of the semiconductor chips 20 is electrically coupled to the solder balls 18 arranged at the interposer 10.

Figure 3:
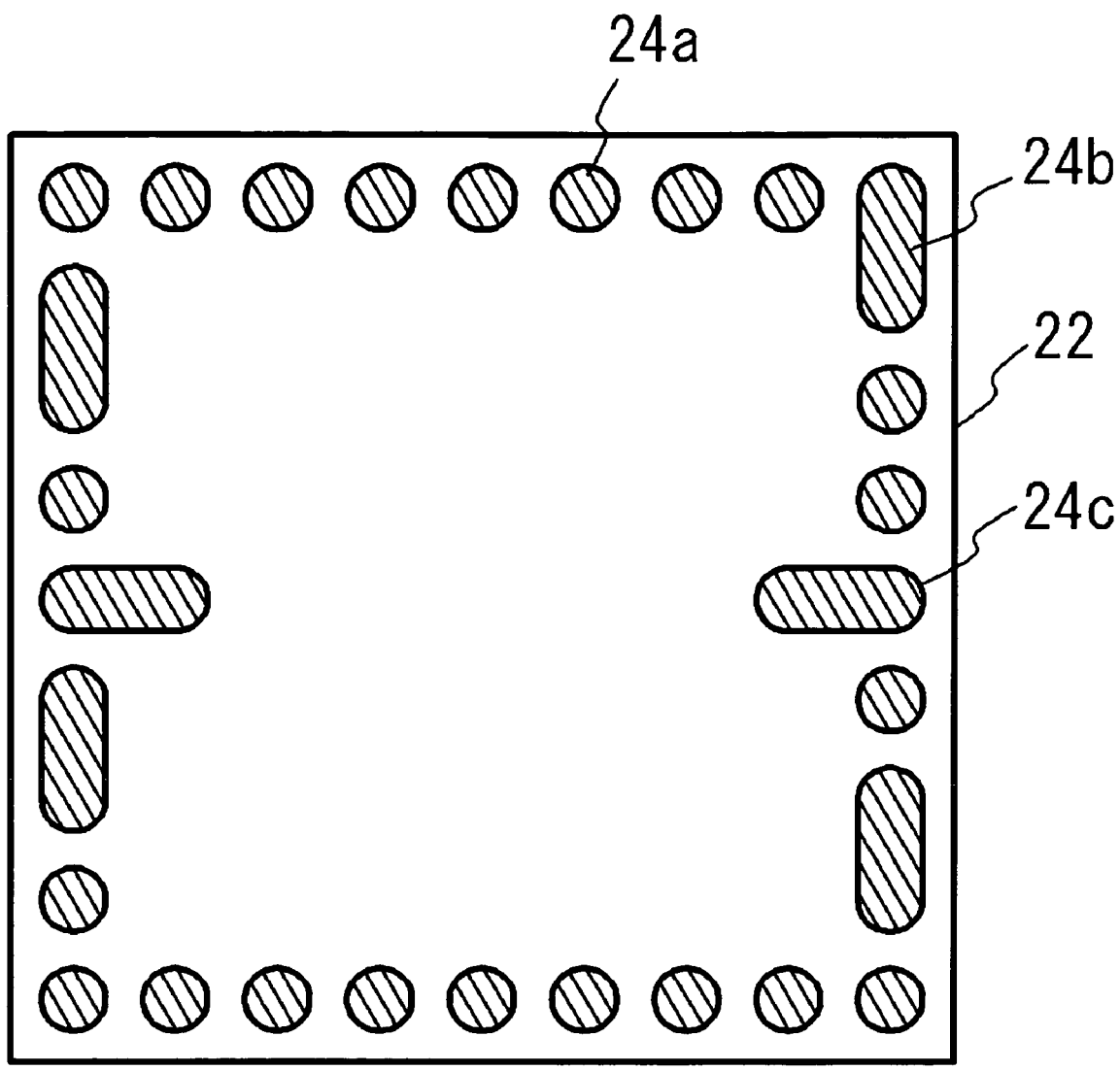
FIG. 3 is a plan view of an anisotropic conductive film in accordance with the first embodiment of the present invention.

The wiring pattern of the anisotropic conductive film employed in the first embodiment is, for example, shown in FIG. 3. Referring to FIG. 3, wiring patterns 24a are provided for coupling the via holes 26 substantially located at vertically same positions in the upper and lower semiconductor chips 20. Wiring patterns 24b are provided for coupling adjacent via holes 26. Wiring patterns 24c are provided for coupling the via holes 26 located at vertically different positions. In this manner, by forming the wiring patterns 24 arbitrarily, it is possible to couple the via holes 26 substantially located at same positions in the upper and lower semiconductor chips 20 and couple the via holes 26 vertically located at different positions. Here, the wiring patterns 24 of the anisotropic conductive films 22 employed in the first embodiment run through the top and bottom surfaces of the anisotropic conductive film 22. However, at least a portion of the wiring patterns 24 may run through the top and bottom surfaces of the anisotropic conductive films 22.

Figure 4A:
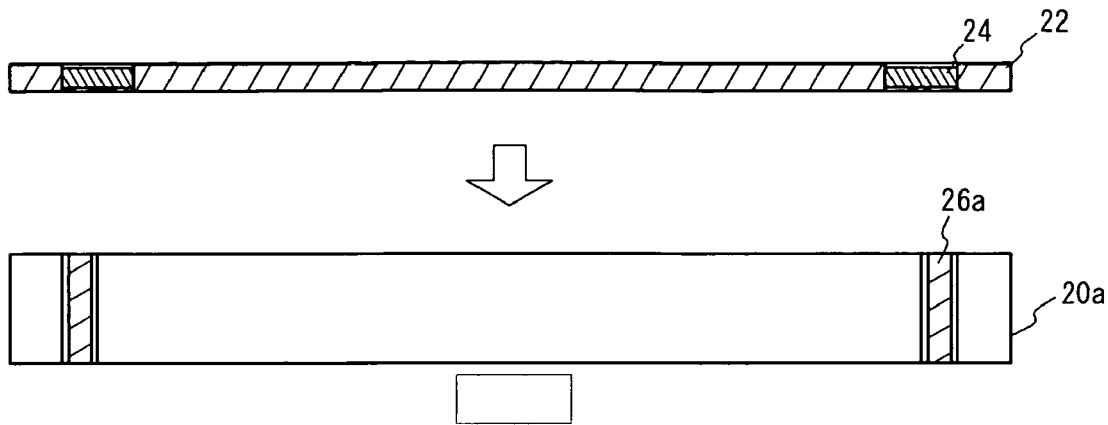
FIG. 4A, FIG. 4B, and FIG. 4C show a fabrication method of the semiconductor device in accordance with the first embodiment of the present invention.
Figure 4B:
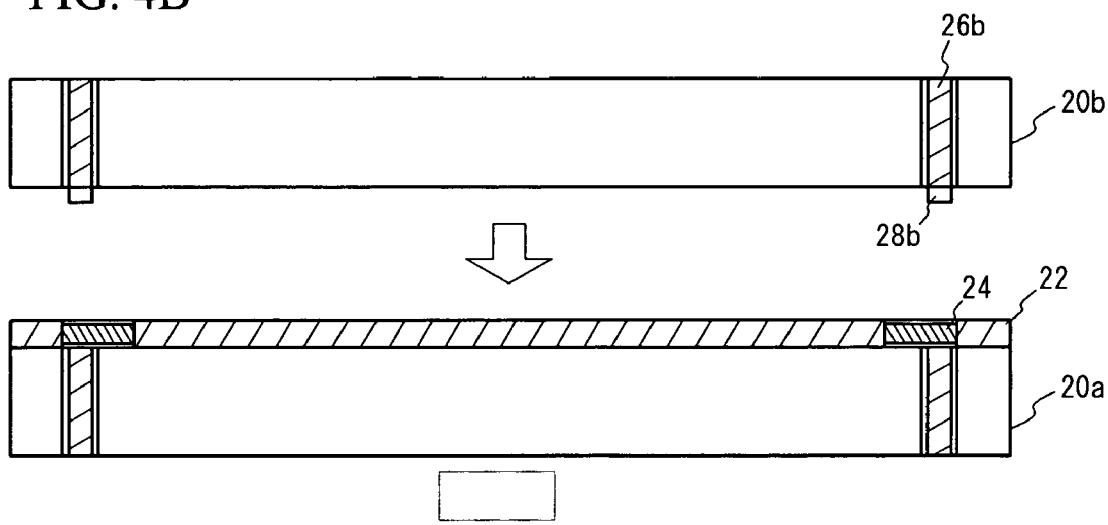
Figure 4C:
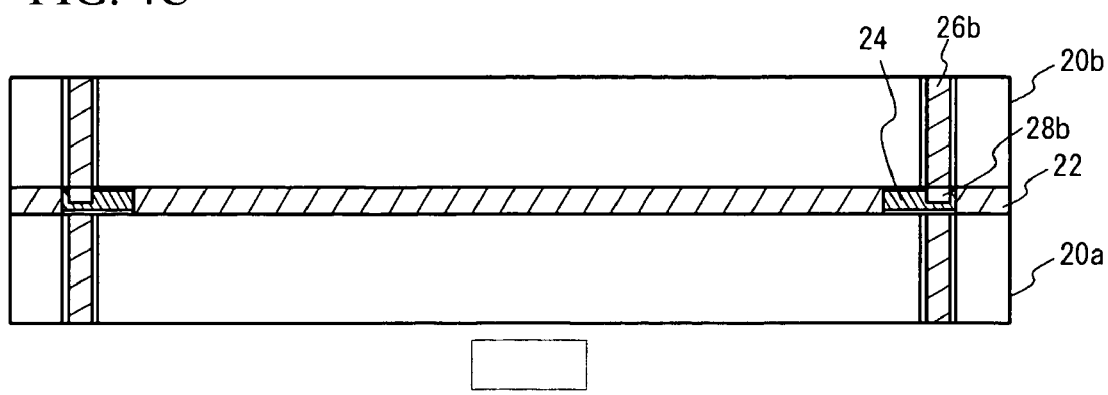

FIG. 4A through FIG. 4C show a fabrication method of coupling a lower semiconductor chip 20a and an upper semiconductor chip 20b with the use of the anisotropic conductive film 22. Referring to FIG. 4A, the anisotropic conductive film 22 having the wiring patterns 24, at least a portion of which runs through the top and bottom surfaces of the anisotropic conductive film 22 (in other words, the wiring pattern 24 includes at least a conductive portion that runs through the top and bottom surfaces of the anisotropic conductive film 22), is provided on the lower semiconductor chip 20a (first substrate) having via holes 26a. Referring to FIG. 4B, the upper semiconductor chip 20b (second substrate) is provided on the anisotropic conductive film 22 to be electrically coupled to the lower semiconductor chip 20a (first substrate) via the conductive portion of the wiring patterns 24 formed in the anisotropic conductive film 22 through the top and bottom surfaces of the anisotropic conductive film 22. Referring to FIG. 4C, pressure is applied on the upper semiconductor chip 20b and the lower semiconductor chip 20a. This allows via holes 26b in the upper semiconductor chip 20b to be electrically coupled to via holes 26b in the lower semiconductor chip 20a via bumps 28b and the wiring patterns 24. The semiconductor chips 20a and 20b are set, for example, to 100 µm to 300 µm, in thickness, and the bump 28b is set to approximately 30 µm in thickness. The present invention, however, is not limited thereto. Preferably, copper or gold of excellent conductivity is embedded in the via holes 26a and 26b. Preferably, the bumps 28b are made of a metal that includes copper, gold, nickel, or solder, which is excellent in conductivity or easy in formation. Here, as the solder, for example, lead-tin (PbSn) solder, lead-free solder (SnAgCu and the like), tin-zinc (SnZn) solder, or the like may be used.

Figure 5A:
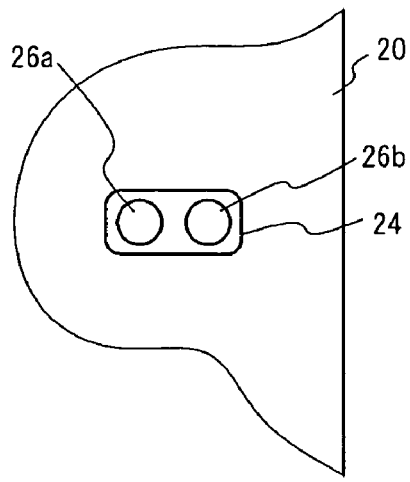
FIG. 5A, FIG. 5B, FIG. 5C, and FIG. 5D are views explaining electrical coupling of a case where via holes are located at different positions between an upper semiconductor chip and a lower semiconductor chip in the semiconductor device in accordance with the first embodiment of the present invention.
Figure 5B:
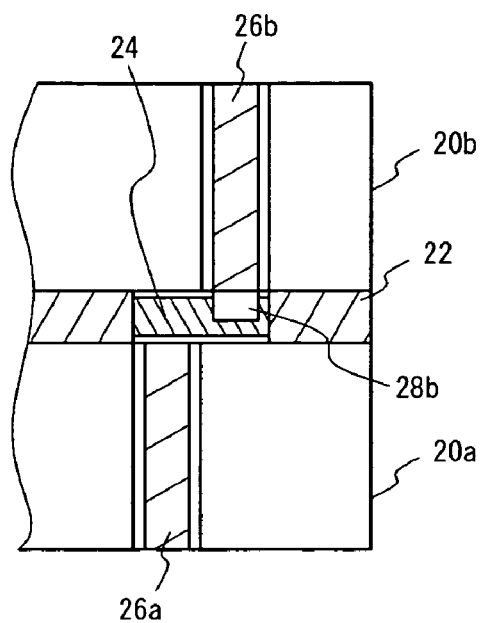
Figure 5C:
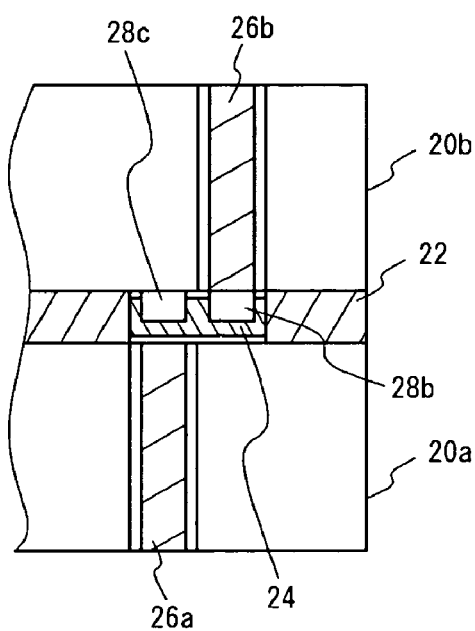
Figure 5D:
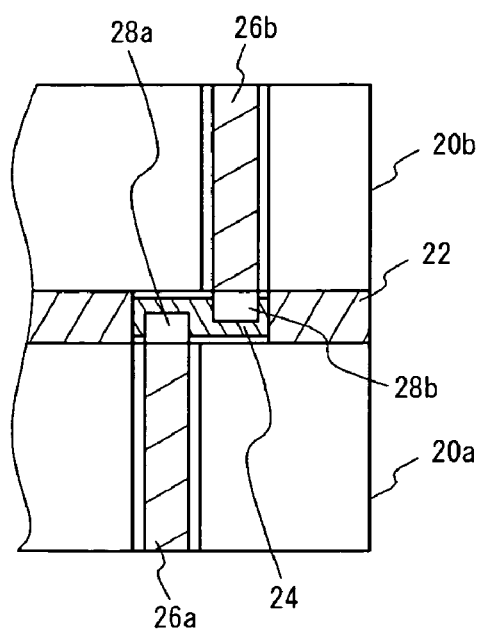

FIG. 5A through FIG. 5D are views explaining electrical coupling of a case where the via holes 26a and 26b are located at different positions between the upper semiconductor chip 20b and the lower semiconductor chip 20a. FIG. 5A is a plan view showing a positional relationship of the wiring pattern 24 of the anisotropic conductive film 22 and the via holes 26a and 26b. The position of the via hole 26a in the lower semiconductor chip 20a and that of the via hole 26b in the upper semiconductor chip 20b are different and connected by the wiring pattern 24. FIG. 5B through FIG. 5D are cross-sectional views thereof. FIG. 5B shows an example in which the bump 28b is formed to be electrically coupled to the via hole 26b in the upper semiconductor chip 20b. FIG. 5C shows an example in which a bump 28c is formed at the upper semiconductor chip 20b above which the via hole 26a is provided, in addition to the configuration shown in FIG. 5B. The bump 28c is not connected to the via hole 26b, and is a dummy bump. FIG. 5D shows an example in which the bump 28a is formed to be electrically coupled to the via hole 26a, in addition to the configuration shown in FIG. 5B.

As described heretofore, the semiconductor device employed in the first embodiment includes: the lower semiconductor chip 20a (first substrate); the anisotropic conductive film 22 that is provided on the lower semiconductor chip 20a (first substrate) and that has the wiring pattern 24, at least a portion of which runs through the top and bottom surfaces of the anisotropic conductive film 22 (in other words, the wiring pattern 24 at least includes a portion that provides conductivity through the top and bottom surfaces of the anisotropic conductive film 22); and the upper semiconductor chip 20b (second substrate) provided on the anisotropic conductive film 22 to be electrically coupled to the lower semiconductor chip 20a (first substrate) via the anisotropic conductive film 22. This makes it possible to electrically couple vertically different positions between in the upper semiconductor chip 20b and in the lower semiconductor chip 20a. In addition, the production costs can be lowered by employing the anisotropic conductive film having the wiring pattern. It is only necessary that a portion of the wiring pattern runs through the top and bottom surfaces of the anisotropic conductive film 22.

As shown in FIG. 5B through FIG. 5D, at least one of the lower semiconductor chip 20a (first substrate) and the upper semiconductor chip 20b (second substrate) has the bump 28 (metal protruding portion), and is electrically coupled to the wiring pattern 24 of the anisotropic conductive film 22 via the bump 28 (metal protruding portion). In some cases, the wiring pattern 24 is thinner than another portion of the anisotropic conductive film 22. In such case, by bringing the bump 28c into contact with the wiring pattern 24, the wiring pattern 24 is brought into contact with the semiconductor chip 20a on the opposite side of the bump 28c. It is therefore possible to electrically couple the semiconductor chips 20a and 20b to the wiring pattern 24, with more certainty. Here, the first embodiment is an example of coupling the via holes 26 in the semiconductor chips 20. Yet, the wiring or electrode formed in the semiconductor chip 20 may be coupled.

Second Embodiment

Figure 6:
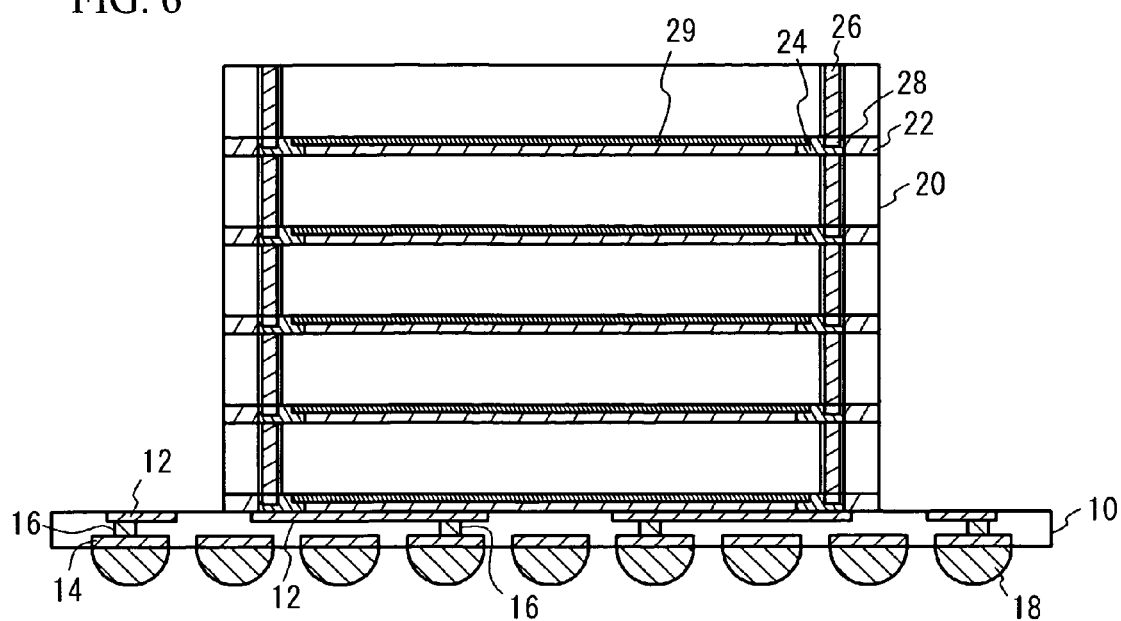
FIG. 6 is a cross-sectional view of a semiconductor device in accordance with a second embodiment of the present invention.

A second embodiment of the present invention is an example in which there is provided an insulating film between the anisotropic conductive film 22 and the semiconductor chip 20 (first or second substrate), in addition to the configuration shown in FIG. 2 used in the first embodiment. FIG. 6 is a cross-sectional view of the semiconductor device in accordance with the second embodiment. In addition to the configuration shown in FIG. 2 used in the first embodiment, polyimide films 29 are provided on the surfaces of the semiconductor chips 20. Other configurations are same as those used in the first embodiment, the same components and configurations as those employed in the first embodiment have the same reference numerals, and a detailed explanation will be omitted. The polyimide film 29 is applied on the semiconductor substrate when the semiconductor chip 20 is manufactured. Then, the polyimide film 29 in the regions in which the bumps 28 are formed is removed. The polyimide film 29 makes it possible to prevent a wiring layer in the semiconductor chip 20 and the one or more wiring patterns 24 from being in contact with each other. By this, it is possible to provide a highly reliable semiconductor device. Here, the present invention is not limited to the polyimide film 29, and may employ any insulating film. Also, it is only necessary that the polyimide film 29 be formed on at least one of the surfaces of the upper and lower semiconductor chips 20 (first and second substrates).

Third Embodiment

Figure 7:
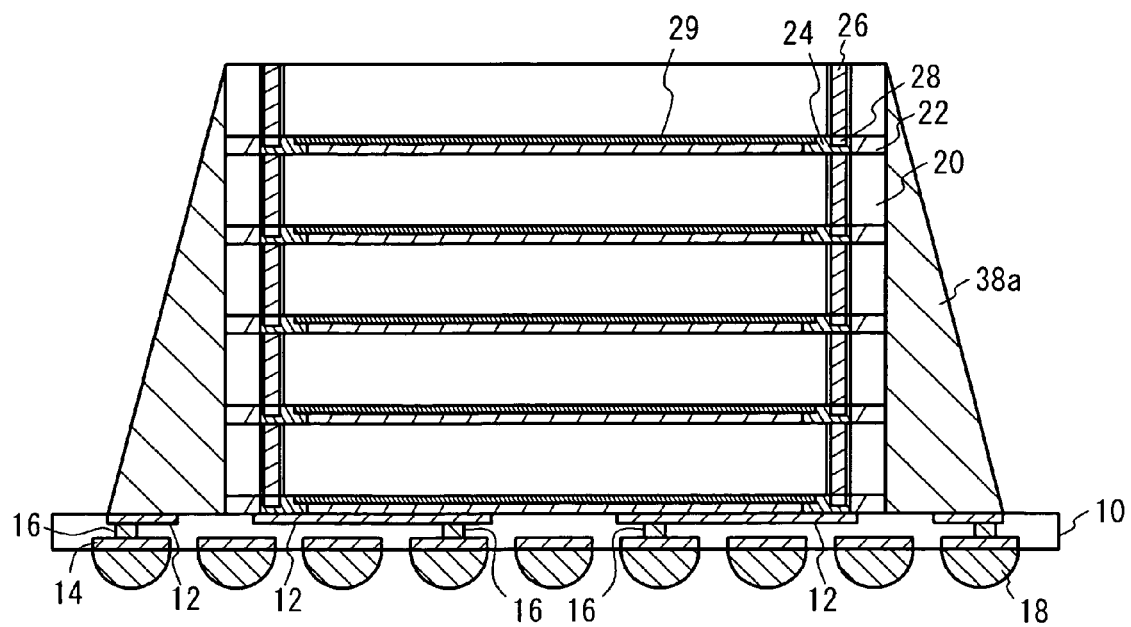
FIG. 7 is a first cross-sectional view of a semiconductor device in accordance with a third embodiment of the present invention.
Figure 8:
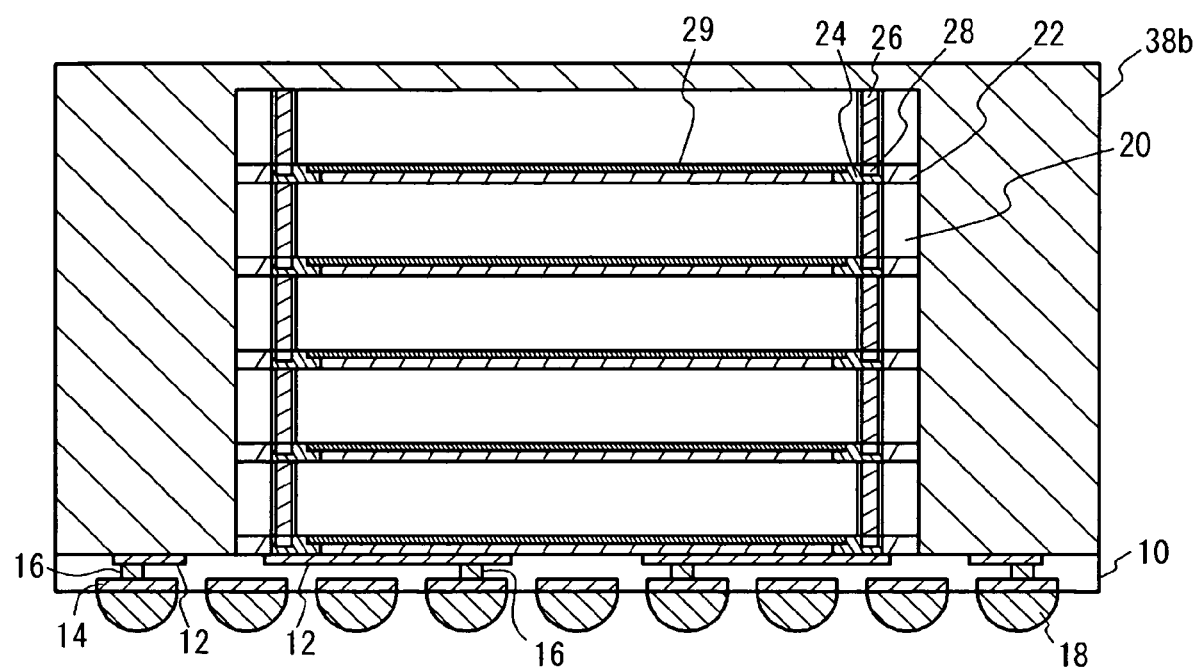
FIG. 8 is a second cross-sectional view of the semiconductor device in accordance with the third embodiment of the present invention.

A third embodiment of the present invention is an example in which there is provided a sealing resin portion that seals the semiconductor chips 20 (first substrate and the second substrate), in addition to the configuration shown in FIG. 6 used in the second embodiment. FIG. 7 and FIG. 8 are cross-sectional views of the semiconductor device in accordance with the third embodiment of the present invention. The side surfaces of the semiconductor chips 20 shown in FIG. 7 and the whole semiconductor chips 20 shown in FIG. 8 are respectively sealed with sealing resin portions 38a and 38b made of, for example, epoxy resin, polyimide resin, or the like. Other configurations are same as those shown in FIG. 6 used in the second embodiment, the same components and configurations have the same reference numerals, and a detailed explanation will be omitted.

Fourth Embodiment

Figure 9A:
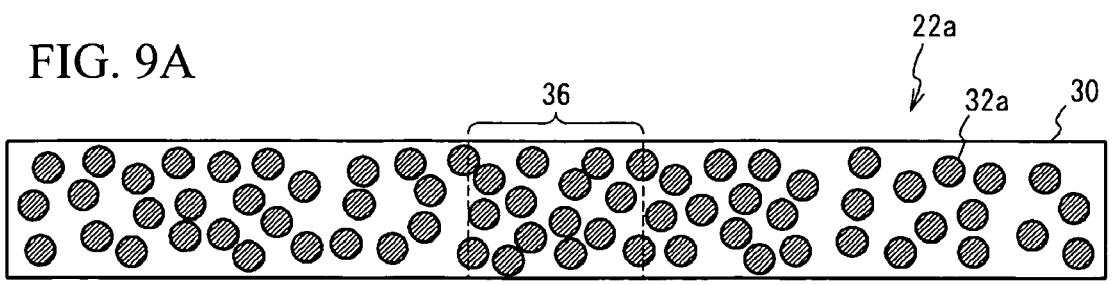
FIG. 9A, FIG. 9B, FIG. 9C, and FIG. 9D show a film fabrication method of the semiconductor device in accordance with a fourth embodiment of the present invention.
Figure 9B:
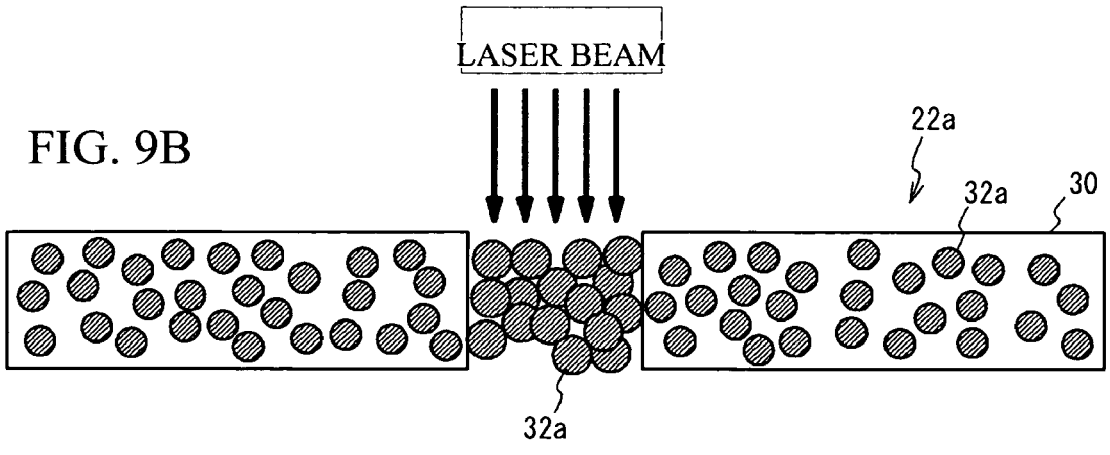
Figure 9C:
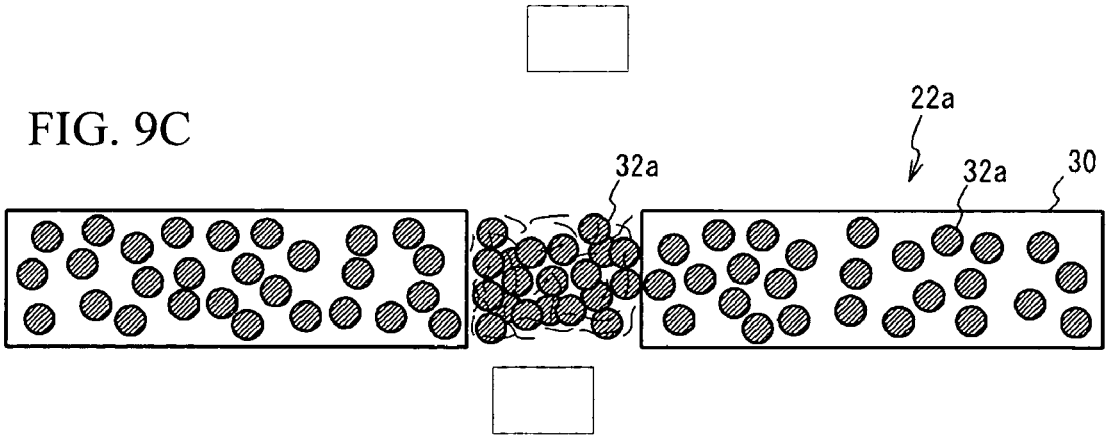
Figure 9D:
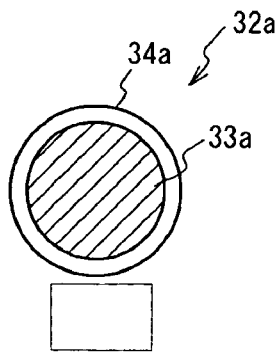

Next, a description will be given of a fabrication method of an anisotropic conductive film 22a having the wiring pattern 24 employed in a fourth embodiment of the present invention. Referring to FIG. 9A, fabricated is the anisotropic conductive film 22a in which conductive particles 32a are included in the base substance 30 of, for example, epoxy resin or the like. The conductive particles 32a has a structure of an insulating particle 33a covered with a metal coating film 34a (metal film), as shown in FIG. 9D. A region 36 in FIG. 9A is provided for forming the wiring pattern 24. Referring to FIG. 9B, the anisotropic conductive film 22a is exposed to a laser beam. As the laser beam, $CO_2$ laser having the wavelength of, for example, 10.6 µm, is used. When the anisotropic conductive film 22a is exposed to a laser beam, the base substance 30 of the anisotropic conductive film 22a that has been exposed to a laser beam is removed. Also, the temperature of the conductive particles 32a rises and the insulating particles 33a expand. This brings the metal coating films 34a into contact to be intertwined with each other. Referring to FIG. 9C, even after the anisotropic conductive film 22a is completed the exposure to a laser beam and the temperature of the anisotropic conductive film 22a is lowered, the metal coating films 34a are in contact and intertwined with each other and the region 36 provides conductivity.

Preferably, the insulating particles 33a are made of an insulating material having a large thermal expansion coefficient, and for example, an insulator that includes polyimide resin, epoxy resin, silicon resin, or polyethylene terephthalate resin may be used. The diameter of the insulating particle 33a is, for example, several µm to 10 µm. Preferably, a metal of high electrical conductivity is used for the metal coating film 34a, and, for example, a metal that includes gold, copper, nickel, or solder may be employed. As the solder, for example, lead-tin (PbSn) solder, lead-free solder (SnAgCu and the like), tin-zinc (SnZn) solder, or the like may be used. It is preferable that the thickness of the metal coating film 34a is sub µm to several µm, since the exposure to the laser beam makes the metal coating films 34a easy to be broken and makes the metal coating films 34a of neighboring conductive particles 32a easy to be intertwined with each other. It is preferable that the laser beam be absorbed in the anisotropic conductive film 22 and increase the temperature to have the wavelength of 0.5 µm or more. In the laser beam exposure, the wiring pattern 24 can be formed with ease by scanning the anisotropic conductive film 22. Also, if the wiring pattern 24 that runs through the top and bottom surfaces of the anisotropic conductive film 22 is formed, the focus of the laser beam is set to the center of the anisotropic conductive film 22. Meanwhile, in a case where the wiring pattern 24 is formed only on the top surface or the bottom surface of the anisotropic conductive film 22, the focus of the laser beam is set to the front surface or the bottom surface. As described, the temperature rises in only the front surface or the bottom surface of the anisotropic conductive film 22, and the wiring pattern 24 is only formed either on the front surface or on the bottom surface.

Fifth Embodiment

Figure 10A:
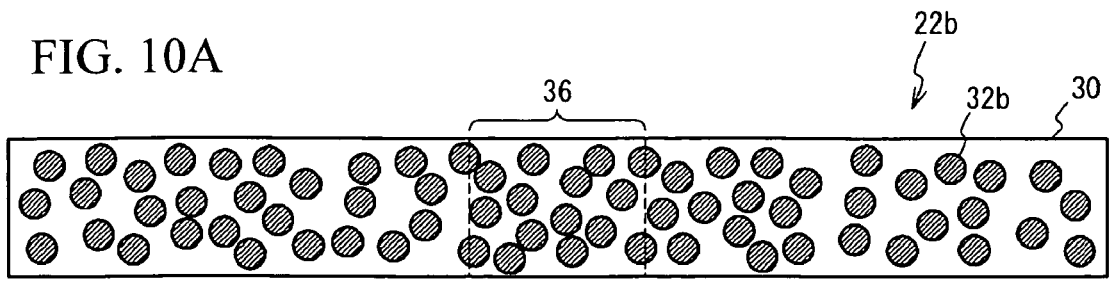
FIG. 10A, FIG. 10B, FIG. 10C, and FIG. 10D show a film fabrication method of the semiconductor device in accordance with a fifth embodiment of the present invention.
Figure 10A:
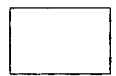
Figure 10B:
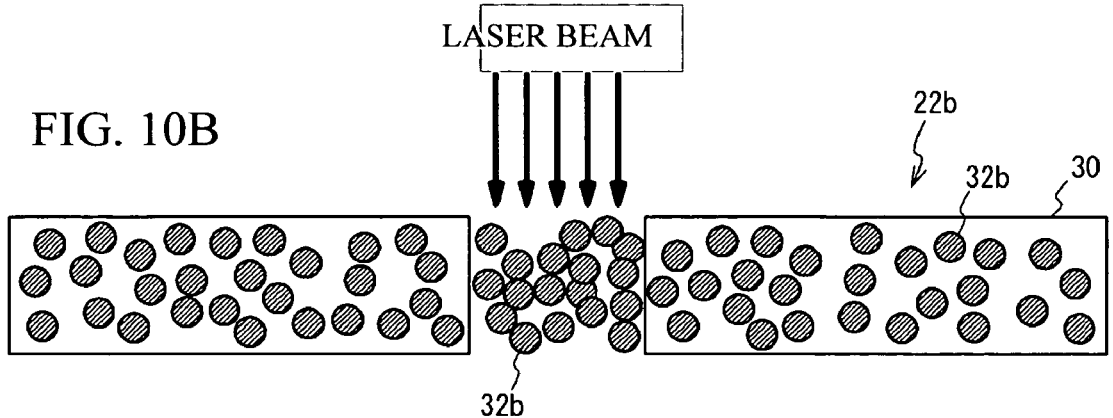
Figure 10B:
Figure 10C:
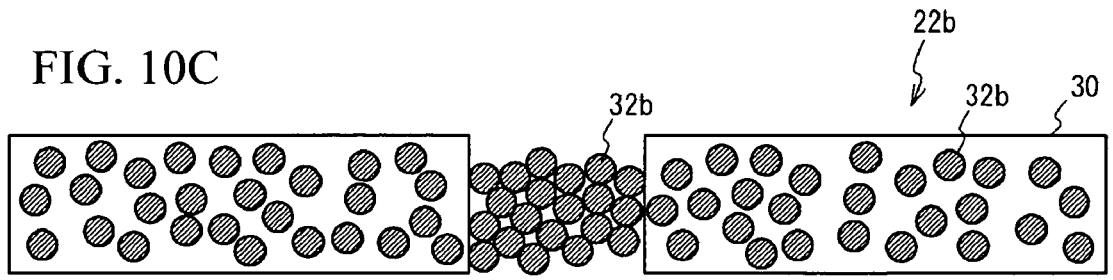
Figure 10C:
Figure 10D:
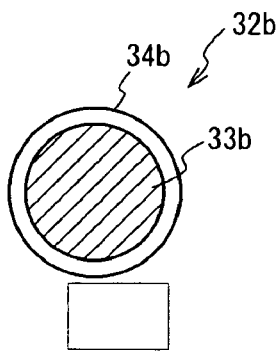

A description will be given of a fabrication method of an anisotropic conductive film 22b having the one or more wiring patterns 24 employed in a fifth embodiment of the present invention. Referring to FIG. 10A, in a similar manner as the fourth embodiment, fabricated is the anisotropic conductive film in which conductive particles 32b are included. The conductive particles 32b has a structure of metal particle 33b covered with a metal coating film 34b (metal film), as shown in FIG. 10D. The diameter of the metal particle 33b is, for example, several µm to 10 µm, and the metal coating film has a thickness of several µm. The region 36 in FIG. 10A is provided for forming the wiring pattern 24. Referring to FIG. 10B, the anisotropic conductive film 22b is exposed to a laser beam. As the laser beam, $CO_2$ laser having the wavelength of, for example, 10.6 µm, is used. When the anisotropic conductive film 22b is exposed to a laser beam, the base substance 30 of the anisotropic conductive film 22b that has been exposed to the laser beam is removed. Also, the temperature of the conductive particles 32b is increased and the metal coating film 34b melts. This brings the metal coating films 34b into contact with each other. Referring to FIG. 10C, even after the exposure to a laser beam is completed and the temperature of the anisotropic conductive film 22a is lowered, the metal coating films 34b are in contact with each other and the region 36 provides conductivity.

Preferably, the metal particles 33b are made of a metal that provides excellent conductivity, and for example, a metal that mainly includes copper may be used. Preferably, the metal coating films 34b are made of a metal easy to be melted, and for example, a metal that includes solder may be used. The diameter of the metal particle 33b, the thickness of the metal coating film 34b, and the wavelength of the laser beam may be same as those used in the fourth embodiment.

In the fourth and fifth embodiments, the anisotropic conductive film 22a or 22b is exposed to a laser beam, and the wiring pattern is formed in the region 36 exposed to the laser beam. This allows the wiring pattern 24 to be formed without using the electroless plating method, unlike the example 6, thereby reducing the production costs.

Also, the anisotropic conductive film 22a or 22b includes the insulating base substance 30 and the conductive particles 32a or 32b therein, and the wiring pattern 24 can be fabricated by exposing the conductive particles 32a or 32b to the laser beam and electrically coupling the conductive particles 32a or 32b with each other. This can reduce the production costs.

The semiconductor device with the anisotropic conductive film 22 fabricated in the method employed in the fourth or fifth embodiment includes an insulating base substrate that includes the conductive particles 32a or 32b, and the conductive particles 32a or 32b are electrically coupled to each other in the wiring pattern 24.

Sixth Embodiment

Figure 11A:
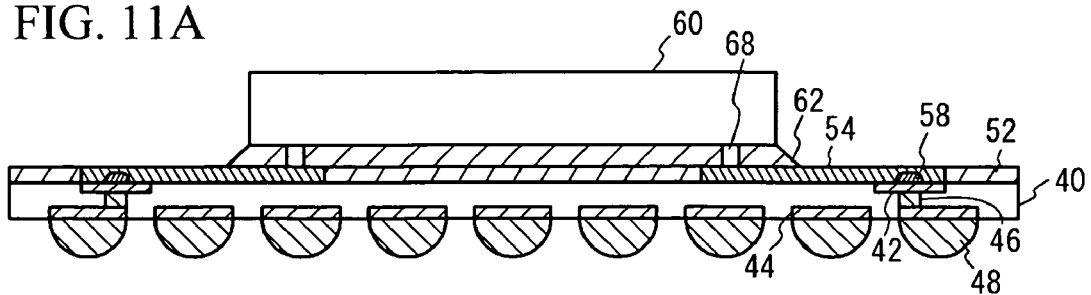
FIG. 11A is a cross-sectional view of the semiconductor device in accordance with a sixth embodiment of the present invention.
Figure 11B:
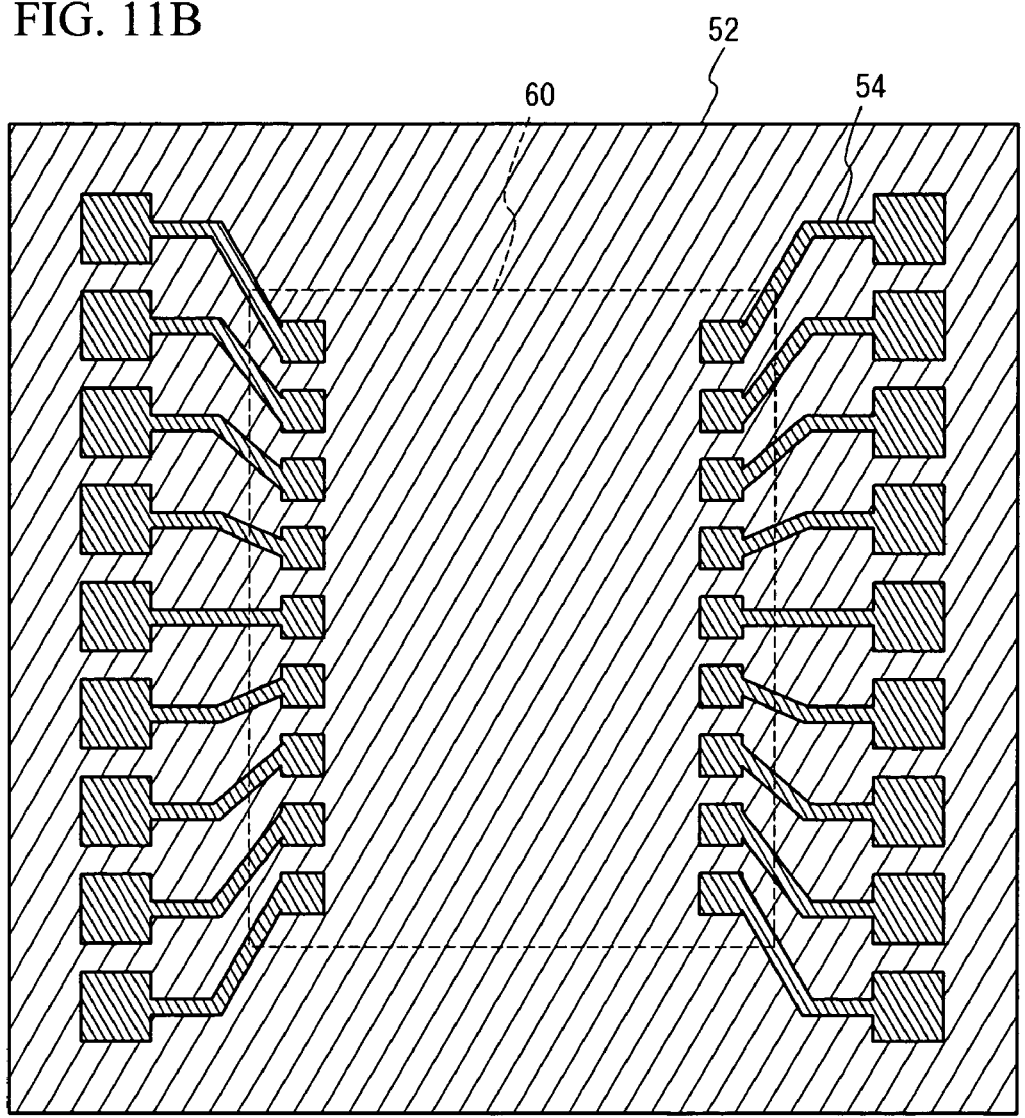
FIG. 11B is a plan view of an anisotropic conductive film in accordance with the sixth embodiment of the present invention.

A sixth embodiment of the present invention is an example in which there is provided an anisotropic conductive film having one or more wiring patterns between the interposer and the semiconductor chip. FIG. 11A is a cross-sectional view of the semiconductor device in accordance with the sixth embodiment of the present invention. FIG. 11B is a plan view of an anisotropic conductive film 52 used in the sixth embodiment of the present invention. Referring to FIG. 11A, the anisotropic conductive film 52 having wiring patterns 54 is provided on an interposer 40, and a semiconductor chip 60 is provided above the anisotropic conductive film 52 via an under-fill resin. Bumps 58 and 68 are respectively provided to the interposer 40 and the semiconductor chip 60. As shown in FIG. 11B, there are provided pads in the wiring patterns 54 of the anisotropic conductive film 52 to be in contact with the bumps 58 and the bumps 68. The bumps 58 and 68 are electrically coupled to each other by bringing into contact with the wiring patterns 54. The bumps 58 are connected to wiring electrodes 42 in the interposer 40. Solder terminals 48 are formed on electrodes 44 on the opposite surface of the semiconductor chip 60 with respect to the interposer 40. The wiring electrodes 42 and the electrodes 44 are coupled by connecting holes 46. Thus, the semiconductor chip 60 and the solder terminals 48 are electrically coupled.

Seventh Embodiment

Figure 12:
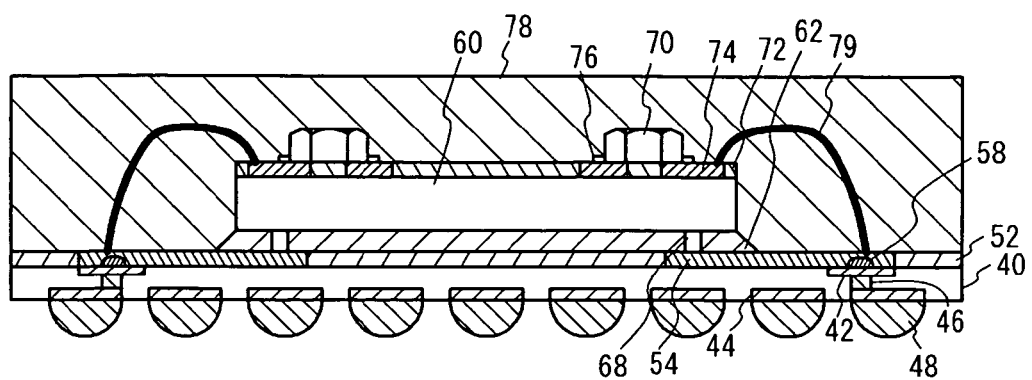
FIG. 12 is a cross-sectional view of the semiconductor device in accordance with a seventh embodiment of the present invention.

A seventh embodiment of the present invention is an example in which a chip capacitor and a semiconductor chip, taking as examples of chip parts, are coupled by using an anisotropic conductive film. FIG. 12 is a cross-sectional view of the semiconductor device in accordance with the seventh embodiment of the present invention. In addition to the configurations shown in FIG. 11A, an anisotropic conductive film 72 having one or more wiring patterns 74 is provided on the semiconductor chip 60, and on the top thereof, chip capacitors 70 are arranged. The chip capacitor 70 and the anisotropic conductive film 72 are electrically coupled by, for example, Ag paste or the like. Also, the wiring patterns 74 of the anisotropic conductive film 72 are electrically coupled to the wiring electrodes 42 of the interposer 40 by using wires 79. The semiconductor chip 60 and the chip capacitors 70 are sealed with a seal resin portion 78. Other configurations are same as those shown in FIG. 11A described in the sixth embodiment, the same components and configurations have the same reference numerals, and a detailed explanation will be omitted.

In the seventh embodiment, the chip capacitors 70 are mounted on the anisotropic conductive film with the use of Ag paste. In the seventh embodiment, the chip capacitors 70 are mounted by Ag paste, thereby eliminating the necessity of the metal protruding portion, such as the bumps or the like, in contact with the wiring pattern, and also eliminating the necessity of applying the pressure on the chip capacitors 70 when mounted, whereas the semiconductor chips 20 are mounted on the anisotropic conductive films 22 by applying pressure on the semiconductor chips 20 in the first embodiment.

Eighth Embodiment

Figure 13:
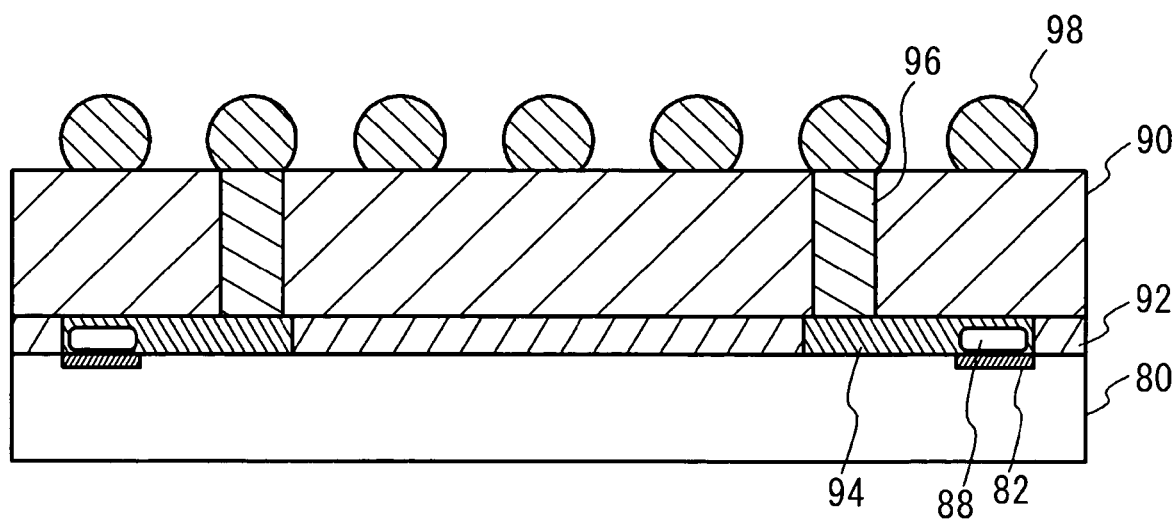
FIG. 13 is a cross-sectional view of the semiconductor device in accordance with an eighth embodiment of the present invention.

An eighth embodiment of the present invention is an example in which the anisotropic conductive film having the one or more wiring patterns is applied to the semiconductor device to be diced, after the substrate and solder balls are formed in a state of a semiconductor wafer. FIG. 13 is a cross-sectional view of the semiconductor device in accordance with the eighth embodiment of the present invention. In a state of a semiconductor wafer, electrodes 82 are formed at a semiconductor substrate 80, and bumps 88 are formed on the electrodes 82. An anisotropic conductive film 92 having wiring patterns 94 therein is attached onto the semiconductor substrate 80. Post metals 96, mainly including copper, are formed to be connected to the wiring patterns 94. A resin 90 is formed on the anisotropic conductive film 92. Solder balls 98 are formed to be connected to the post metals 96. The semiconductor wafer is cut in the dicing process, and the semiconductor devices of a semiconductor chip size are completed. As described in the first through third embodiments and in the sixth through eighth embodiments, the interposer, the semiconductor chip, the chip capacitor, or the like may be used for the substrates that sandwich the anisotropic conductive film having the wiring patterns therein.

Embodiments of the present claimed subject matter generally relates to semiconductor devices. More particularly, embodiments allow semiconductor devices to function with increased efficiency. In one implementation, the claimed subject matter is applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones.).

Flash memory stores information in an array of floating gate transistors, called "cells", each of which traditionally stores one bit of information. However, newer flash memory devices, such as MirrorBit Flash Technology from Spansion Inc., can store more than 1 bit per cell. The MirrorBit cell doubles the intrinsic density of a Flash memory array by storing two physically distinct bits on opposite sides of a memory cell. Each bit serves as a binary bit of data (e.g., either 1 or 0) that is mapped directly to the memory array.

Reading or programming one side of a memory cell occurs independently of whatever data is stored on the opposite side of the cell.

With regards to wireless markets, flash memory that utilizes MirrorBit technology has several key advantages. For example, flash memory that utilizes MirrorBit technology are capable of burst-mode access as fast as 80 MHz, page access times as fast as 25 ns, simultaneous read-write operation for combined code and data storage, and low standby power (e.g., 1 µA).

Figure 14:
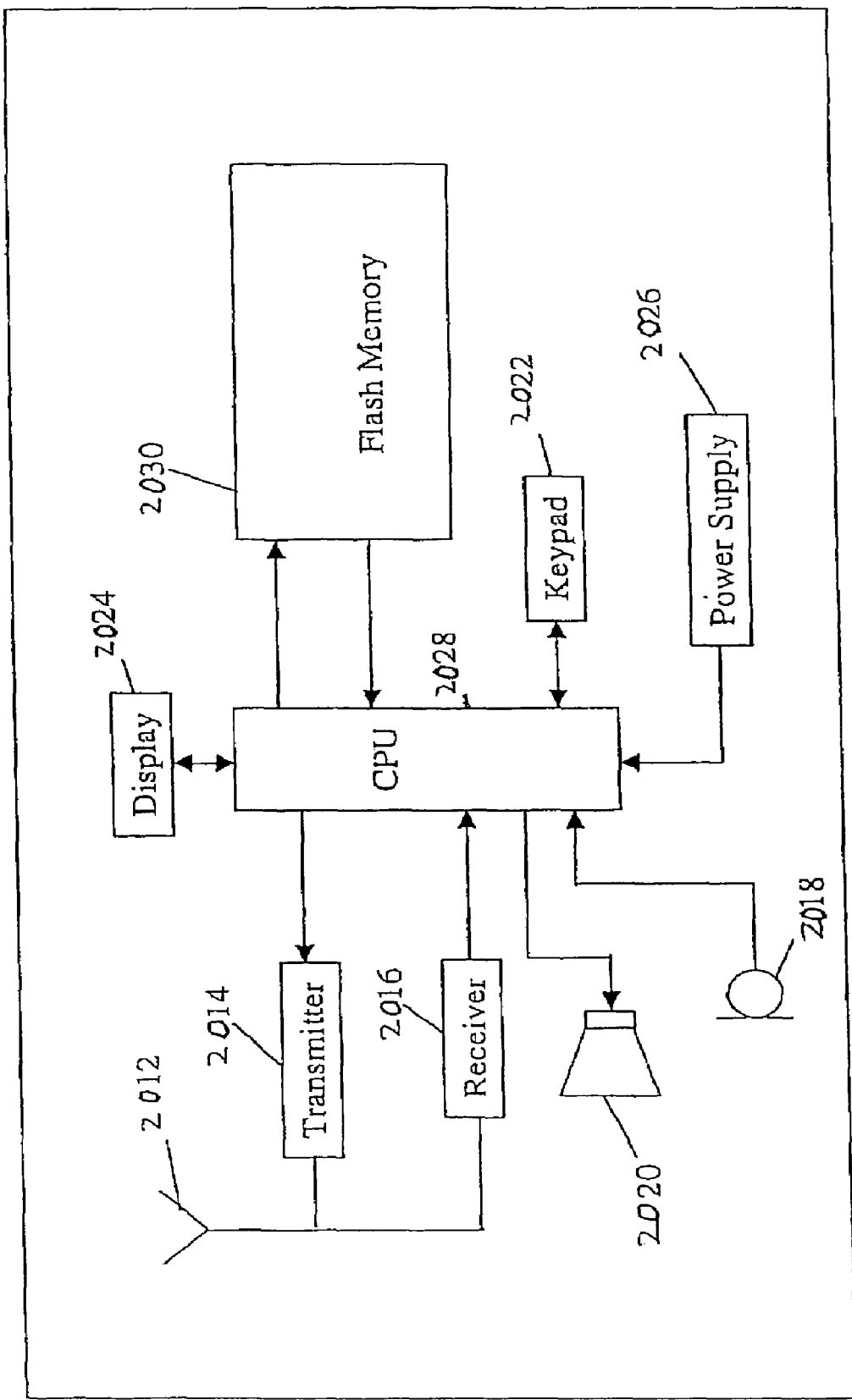
FIG. 14 illustrates a block diagram of a conventional portable phone, upon which embodiments can be implemented.

FIG. 14 shows a block diagram of a conventional portable telephone 2010 (a.k.a. cell phone, cellular phone, mobile phone, internet protocol phone, wireless phone, etc.), upon which embodiments can be implemented. The cell phone 2010 includes an antenna 2012 coupled to a transmitter 2014 a receiver 2016, as well as, a microphone 2018, speaker 2020, keypad 2022, and display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 includes: a first substrate; an anisotropic conductive film that is provided on the first substrate and has a wiring pattern having at least a portion providing conduction through the anisotropic conductive film; and a second substrate provided on the anisotropic conductive film and coupled to the first substrate via the portion providing conduction through the anisotropic conductive film. In this way, embodiments allow production costs to be lowered by electrically coupling different positions in the upper and lower substrates. This improvement can translate into a decrease in cost production for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are connected to the bit lines in a parallel configuration, while in a conventional NAND-type flash memory, the memory cell transistors are connected to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, a more efficient flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

Figure 15:
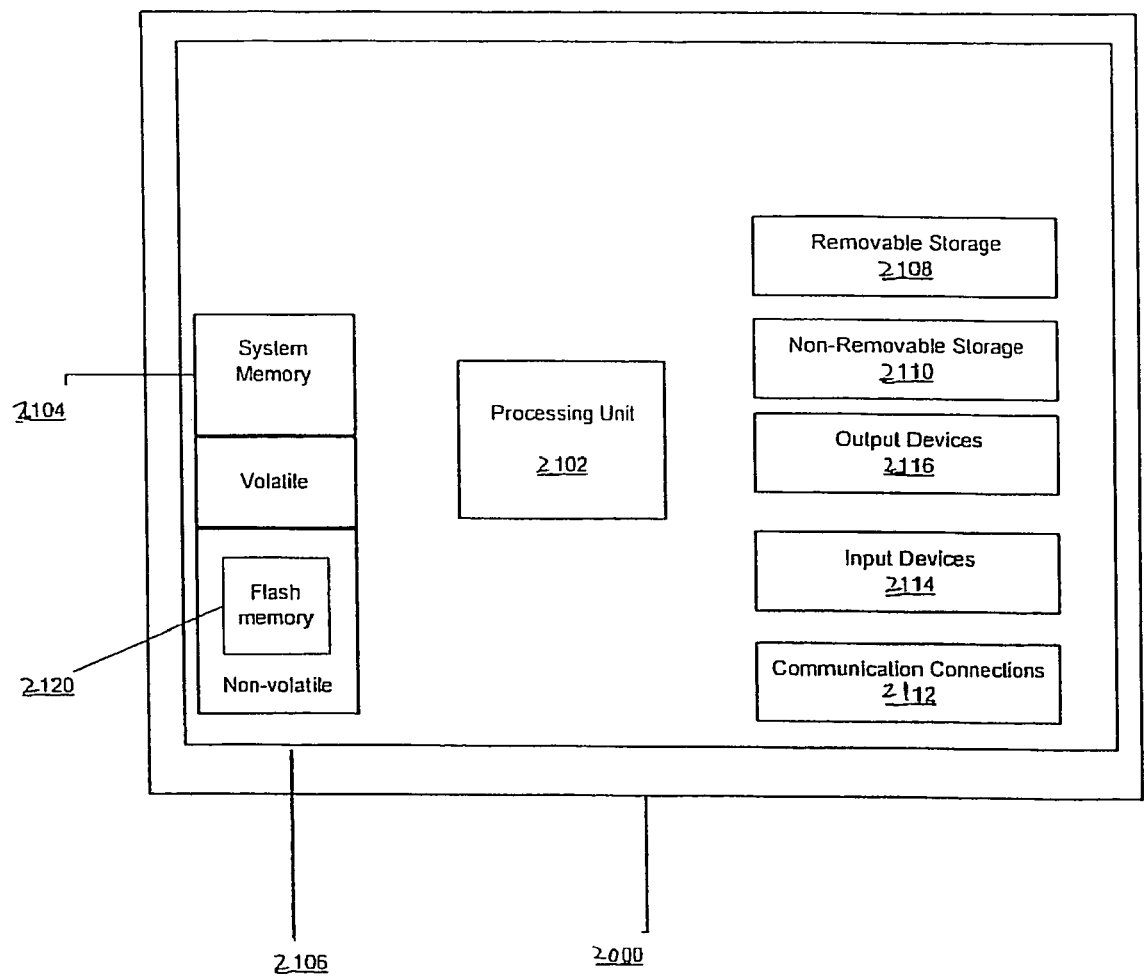
FIG. 15 illustrates a block diagram of a computing device, upon which embodiments of the present claimed subject matter can be implemented.

FIG. 15 illustrates a block diagram of a computing device 2100, upon which embodiments of the present claimed subject matter can be implemented. Although computing device 2100 is shown and described in FIG. 15 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. Similarly, in another example, computing device 2100 can include additional components not shown in FIG. 15.

Also, it is important to note that the computing device 2100 can be a variety of things. For example, computing device 2100 can be but are not limited to a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounters frequent physical impacts. Also, flash memory is more able than other types of memory to withstand intense physical pressure and/or heat. And thus, portable computing devices are able to be used in a greater range of environmental variables.

In its most basic configuration, computing device 2100 typically includes at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 15 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Video Disc (DVD) recorder, the removable storage is a DVD receiving component utilized to receive and read DVDs. Such additional storage is illustrated in FIG. 15 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, the flash memory 2120 comprises: a first substrate; an anisotropic conductive film that is provided on the first substrate and has a wiring pattern having at least a portion providing conduction through the anisotropic conductive film; and a second substrate provided on the anisotropic conductive film and coupled to the first substrate via the portion providing conduction through the anisotropic conductive film. In this way, embodiments allow production costs to be lowered by electrically coupling different positions in the upper and lower substrates. This improvement can translate into a decrease in cost production for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

Further, in one embodiment, the flash memory 2120 utilizes mirrorbit technology to allow storing of two physically distinct bits on opposite sides of a memory cell.

Device 2100 may also contain communications connection(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well know in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous. Also, users would also benefit from reduced memory read time.

Figure 16:
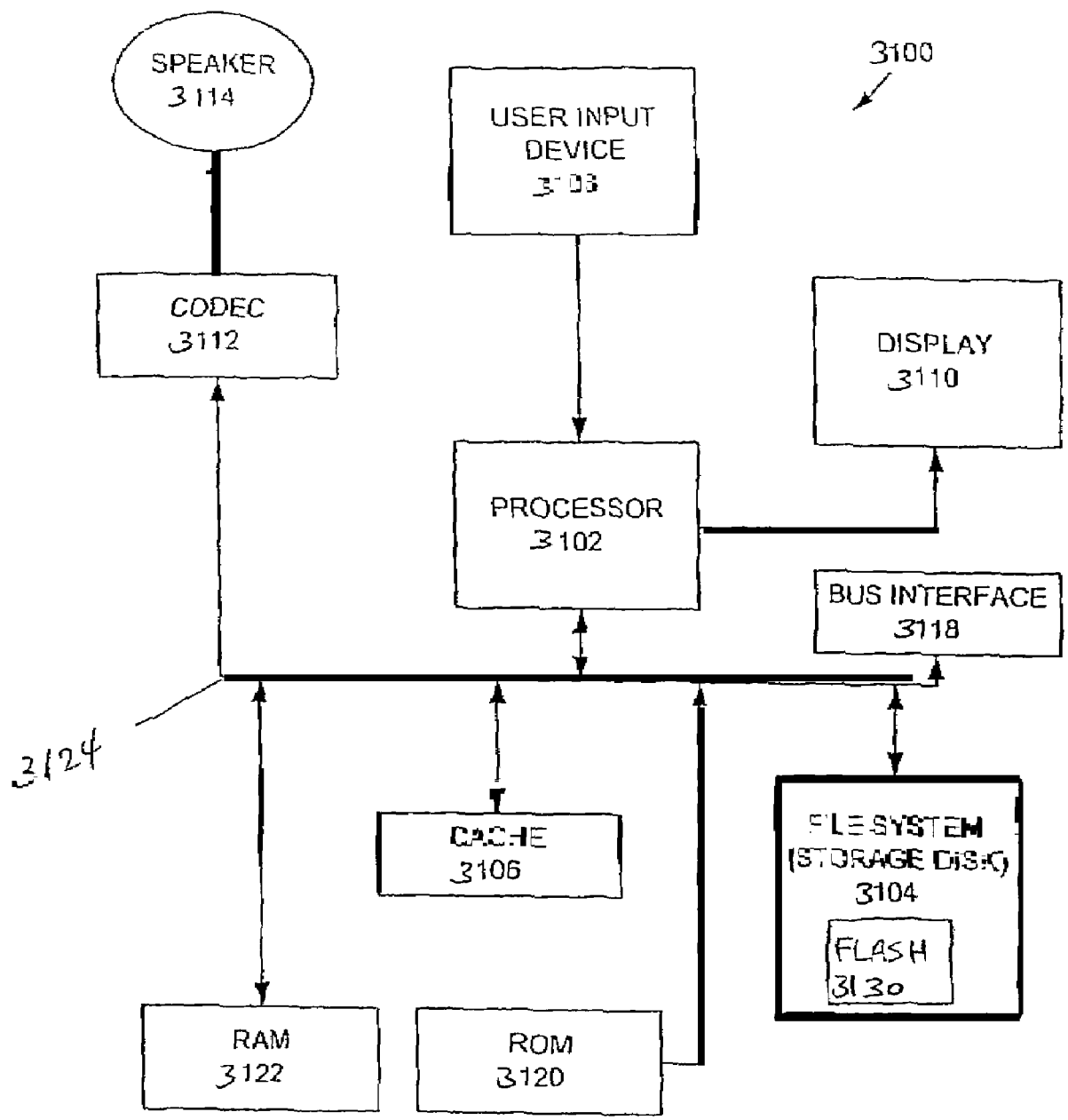
FIG. 16 illustrates an exemplary portable multimedia device, or media player, in accordance with an embodiment of the present claimed subject matter.

FIG. 16 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage disk or a plurality of disks. The file system 3104 typically provides high capacity storage capability for the media player 3100. Also, file system 3104 includes flash memory 3130. In the present embodiment, the flash memory 3130 comprises: a first substrate; an anisotropic conductive film that is provided on the first substrate and has a wiring pattern having at least a portion providing conduction through the anisotropic conductive film; and a second substrate provided on the anisotropic conductive film and coupled to the first substrate via the portion providing conduction through the anisotropic conductive film. In this way, embodiments allow production costs to be lowered by electrically coupling different positions in the upper and lower substrates. This improvement can translate into a decrease in cost production for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3120 and a Read-Only Memory (ROM) 3122. The ROM 3122 can store programs, utilities or processes to be executed in a non-volatile manner. The RAM 3120 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3110. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs) in the file system 3104. When a user desires to have the media player play a particular media item, a list of available media assets is displayed on the display 3110. Then, using the user input device 3108, a user can select one of the available media assets. The processor 3102, upon receiving a selection of a particular media item, supplies the media data (e.g., audio file) for the particular media item to a coder/decoder (CODEC) 3110. The CODEC 3110 then produces analog output signals for a speaker 3114. The speaker 3114 can be a speaker internal to the media player 3100 or external to the media player 3100. For example, headphones or earphones that connect to the media player 3100 would be considered an external speaker.

For example, in a particular embodiment, the available media assets are arranged in a hierarchical manner based upon a selected number and type of groupings appropriate to the available media assets. For example, in the case where the media player 3100 is an MP3 type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

Referring to FIG. 17, the internal configuration of a digital camera 3001 is described. FIG. 17 is a block diagram showing the internal functions of the digital camera 3001. The CCD (image capturing device) 3020 functions as image capturing means for capturing a subject image and generating an electronic image signal and has, for example, 1600 times 1200 pixels. The CCD 3020 photoelectrically converts a light image of the subject formed by the taking lens into image signals (signal made of a signal sequence of pixel signals received by the pixels) of R (red), G (green) and B (blue) pixel by pixel and outputs the image signal.

The image signal obtained from the CCD 3020 is supplied to an analog signal processing circuit 3021. In the analog signal processing circuit 3021, the image signal (analog signal) is subjected to a predetermined analog signal process. The analog signal processing circuit 3021 has a correlated double sampling circuit (CDS) and an automatic gain control circuit (AGC) and adjusts the level of the image signal by performing a process of reducing noise in the image signal by the correlated double sampling circuit and adjusting the gain by the automatic gain control circuit.

An A/D converter 3022 converts each of pixel signals of the image signal into a digital signal of 12 bits. The digital signal obtained by the conversion is temporarily stored as image data in a buffer memory 3054 in a RAM 3050*a*. The image data stored in the buffer memory 3054 is subjected to WB (white balance) process, gamma correction process, color correction process and the like by an image processing unit 3051 and, after that, the processed signal is subjected to a compressing process or the like by a compressing/decompressing unit 3052.

A sound signal obtained from the microphone 3012 is inputted to a sound processing unit 3053. The sound signal inputted to the sound processing unit 3053 is converted into a digital signal by an A/D converter (not shown) provided in the sound processing unit 3053 and the digital signal is temporarily stored in the buffer memory 3054.

An operation unit is an operation unit that can include a power source button and a shutter release button and is used when the user performs an operation of changing a setting state of the digital camera 3001 and an image capturing operation.

A power source 3040 is a power supply source of the digital camera 3001. The digital camera 3001 is driven by using a secondary battery such as a lithium ion battery as the power source battery BT.

An overall control unit 3050 is constructed by a microcomputer having therein the RAM 3050*a* and a ROM 3050*b*. When the microcomputer executes a predetermined program, the overall control unit 3050 functions as a controller for controlling the above-described components in a centralized manner. The overall control unit 3050 also controls, for example, a live view display process and a process of recording data to a memory card. The RAM 3050*a* is a semiconductor memory (such as DRAM) which can be accessed at high speed and the ROM 3050*b* takes the form of, for example, an electrically-rewritable nonvolatile semiconductor memory (such as flash ROM 3050*c*). A flash memory, in one embodiment, includes: a first substrate; an anisotropic conductive film that is provided on the first substrate and has a wiring pattern having at least a portion providing conduction through the anisotropic conductive film; and a second substrate provided on the anisotropic conductive film and coupled to the first substrate via the portion providing conduction through the anisotropic conductive film. In this way, embodiments allow production costs to be lowered by electrically coupling different positions in the upper and lower substrates. This improvement can translate into a decrease in cost production for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

An area as a part of the RAM 3050*a* functions as a buffer area for temporary storing data. This buffer area is referred to as the buffer memory 3054. The buffer memory 3054 temporarily stores image data and sound data.

The overall control unit 3050 has the image processing unit 3051, compressing/decompressing unit 3052 and sound processing unit 3053. The processing units 3051, 3052 and 3053 are function parts realized when the microcomputer executes a predetermined program.

The image processing unit 3051 is a processing unit for performing various digital imaging processes such as WB process and gamma correcting process. The WB process is a process of shifting the level of each of the color components of R, G and B and adjusting color balance. The gamma correcting process is a process of correcting the tone of pixel data. The compressing/decompressing unit 3052 is a processing unit for performing an image data compressing process and an image data decompressing process. As the compressing method, for example, the JPEG method is employed. The sound processing unit 3053 is a processing unit for performing various digital processes on sound data.

A card interface (I/F) 3060 is an interface for writing/reading image data to/from the memory card 3090 inserted into the insertion port in the side face of the digital camera 1. At the time of reading/writing image data from/to the memory card 3090, the process of compressing or decompressing image data is performed according to, for example, the JPEG method in the compressing/decompressing unit 3052, and image data is transmitted/received between the buffer memory 3054 and the memory card 3090 via the card interface 3060. Also at the time of reading/writing sound data, sound data is transmitted/received between the buffer memory 3054 and the memory card 3090 via the card interface 3060.

Further, by using the card interface 3060, the digital camera 3001 transmits/receives data such as an image and sound and, in addition, can load a program which operates on the digital camera 3001. For example, a control program recorded on the memory card 3090 can be loaded into the RAM 3050*a* or ROM 3050*b* of the overall control unit 3050. In such a manner, the control program can be updated.

Also by communication with an external device (such as an external computer) via a USB terminal, various data such as an image and sound and a control program can be transmitted/received. For example, various data, a program, and the like recorded on a recording medium (CD-R/RW or CD-ROM) which is set into a reader (optical drive device or the like) of the external computer can be obtained via the USB terminal.

According to a first aspect of the present invention, there is preferably provided a semiconductor device including: a first substrate; an anisotropic conductive film that is provided on the first substrate and has a wiring pattern having at least a portion providing conduction through the anisotropic conductive film; and a second substrate provided on the anisotropic conductive film and coupled to the first substrate via the portion providing conduction through the anisotropic conductive film.

In the above-described semiconductor device, at least one of the first substrate and the second substrate may have a metal protruding portion and is connected to the anisotropic conductive film via the metal protruding portion.

In the above-described semiconductor device, the metal protruding portion may mainly include any one of gold, copper, nickel and solder.

The above-described semiconductor device may further include an insulating film provided between the anisotropic conductive film and at least one of the first substrate and second substrate. The first substrate or the second substrate can be prevented from touching the wiring pattern. This enables a highly reliable semiconductor device.

The above-described semiconductor device may further include a seal resin portion sealing at least one of the first substrate and the second substrate. The first substrate or the second substrate can be protected by the seal resin portion.

In the above-described semiconductor device, at least one of the first substrate and second substrate may include a semiconductor substrate.

In the above-described semiconductor device, the anisotropic conductive film may have an insulating substance including conductive particles, the conductive particles electrically coupled to each other in the wiring pattern. The production costs can be further reduced.

In the above-described semiconductor device, each of the conductive particles may be an insulating particle covered with a metal film. The production costs can be further reduced.

In the above-described semiconductor device, the insulating particle may include any one of polyimide resin, epoxy resin, silicon resin, and polyethylene terephthalate resin. The thermal expansion coefficient of the insulating particles can be made greater, and the metals covering the insulating particles can be coupled at the time of laser exposure.

In the above-described semiconductor device, each of the conductive particles may be a metal particle covered with a metal film. The production costs can be further reduced.

In the above-described semiconductor device, the metal particle may include copper, and the metal film includes solder. It is possible to employ the conductive particles made of metal particles that provide excellent conductivity and metal films that provide excellent melting characteristic.

According to a second aspect of the present invention, there is preferably provided a method of fabricating a semiconductor device including: providing, on a first substrate, an anisotropic conductive film having a wiring pattern having at least a portion providing conduction through the anisotropic conductive film; and providing, on the anisotropic conductive film, a second substrate coupled to the first substrate via the portion providing conduction through the anisotropic conductive film.

The above-described method may further include exposing the anisotropic conductive film to a laser beam so that the wiring pattern is formed in a region exposed thereto, and providing the anisotropic conductive film may include providing the anisotropic conductive film formed by exposing the anisotropic conductive film to the laser beam. It is possible to provide a fabrication method of the semiconductor device at lower costs.

In the above-described method, the anisotropic conductive film may have an insulating substance including conductive particles; and forming the wiring pattern may include electrically coupling the conductive particles to each other by exposing the conductive particles to the laser beam. It is possible to provide a fabrication method of the semiconductor device at lower costs.

According to a third aspect of the present invention, there is preferably provided a method of fabricating a film including exposing an anisotropic conductive film to a laser beam so that a wiring pattern is formed in a region exposed thereto, the wiring pattern having at least a portion providing conduction through the anisotropic conductive film. It is possible to provide a film fabrication method at low production costs, by forming the wiring pattern in the laser exposure.

It is possible to provide a semiconductor device in which production costs can be reduced in electrically coupling different positions in upper and lower substrates, a fabrication method therefor, and a film fabrication method.

Although a few preferred embodiments of the present invention have been shown and described, it would be appreciated by those skilled in the art that changes may be made in these embodiments without departing from the principles and spirit of the invention, the scope of which is defined in the claims and their equivalents.

The invention claimed is:

1. A semiconductor device comprising;
a first substrate having a first via hole;
an anisotropic conductive film provided on the first substrate;
a second substrate having a second via hole provided on the anisotropic conductive film; and
a wiring pattern formed in the anisotropic conductive film for providing a conduction of the first via hole of the first substrate and the second via hole of the second substrate, the wiring pattern formed in a region of the anisotropic conductive film exposed to a laser beam.

2. The semiconductor device as claimed in claim 1, wherein at least one of the first substrate and the second substrate has a metal protruding portion and is connected to the anisotropic conductive film via the metal protruding portion.

3. The semiconductor device as claimed in claim 2, wherein the metal protruding portion mainly includes any one of gold, copper, nickel and solder.

4. The semiconductor device as claimed in claim 1, further comprising an insulating film provided between the anisotropic conductive film and at least one of the first substrate and second substrate.

5. The semiconductor device as claimed in claim 1, further comprising a seal resin portion sealing at least one of the first substrate and the second substrate.

6. The semiconductor device as claimed in claim 1, wherein at least one of the first substrate and second substrate include a semiconductor substrate.

7. The semiconductor device as claimed in claim 1, wherein the anisotropic conductive film has an insulating substance including conductive particles, the conductive particles electrically coupled to each other in the wiring pattern.

8. The semiconductor device as claimed in claim 7, wherein each of the conductive particles is an insulating particle covered with a metal film.

9. The semiconductor device as claimed in claim 8, wherein the insulating particle includes any one of polyimide resin, epoxy resin, silicon resin, and polyethylene terephthalate resin.

10. The semiconductor device as claimed in claim 7, wherein each of the conductive particles is a metal particle covered with a metal film.

11. The semiconductor device as claimed in claim 10, wherein the metal particle includes copper, and the metal film includes solder.

12. The semiconductor device of claim 1, wherein the wiring pattern is formed only on a top surface or a bottom surface of the anisotropic conductive film.

13. A method of fabricating a semiconductor device comprising:
forming, on a first substrate having a first via hole, an anisotropic conductive film;

forming, on the anisotropic conductive film, a second substrate having a second via hole;

forming a wiring pattern in the anisotropic conductive film to provide a conduction of the first via hole of the first substrate and the second via hole of the second substrate; and exposing a region of the anisotropic conductive film to a laser beam so that the wiring pattern is formed in the region of the anisotropic conductive film exposed to the laser beam.

14. The method as claimed in claim 13, wherein the anisotropic conductive film has an insulating substance including conductive particles; and wherein the forming the wiring pattern includes electrically coupling the conductive particles to each other by exposing the conductive particles to the laser beam.

15. The method of fabricating a semiconductor device of claim 13, wherein the wiring pattern is formed on a top surface of the anisotropic conductive film by setting the focus of the laser beam to the top surface of the anisotropic conductive film.

16. The method of fabricating a semiconductor device of claim 13, wherein the wiring pattern is formed on a bottom surface of the anisotropic conductive film by setting the focus of the laser beam to the bottom surface of the anisotropic conductive film.

17. The method of fabricating a semiconductor device of claim 13, wherein the wiring pattern is formed in the anisotropic conductive film by setting the focus of the laser beam to the center of the anisotropic conductive film.

18. A wireless communications device, said wireless communications device comprising:

a flash memory comprising:

a first substrate;

an anisotropic conductive film provided on the first substrate;

a second substrate having a second via hole provided on the anisotropic conductive film; and a wiring pattern for providing a conduction of the first via hole of the first substrate and the second via hole of the second substrate, the wiring pattern formed in a region of the anisotropic conductive film exposed to a laser beam;

a processor;

a communications component;

a transmitter circuit;

a receiver circuit; and an antenna connected to the transmitter circuit and the receiver circuit.

19. The wireless communications device of claim 18, wherein said flash memory is NAND flash memory.

20. The wireless communications device of claim 18, wherein said flash memory is NOR flash memory.

21. The wireless communications device of claim 18, wherein said flash memory utilizes mirrorbits technology.

22. A computing device comprising:
a processor:
an input component;
an output component;
a memory comprising:
a volatile memory; and
a flash memory comprising:
a first substrate having a first via hole;
an anisotropic conductive film provided on the first substrate;
a second substrate having a second via hole provided on the anisotropic conductive film; and
a wiring pattern for providing a conduction of the first via hole of the first substrate and the second via hole of the second substrate, the wiring pattern formed in a region of the anisotropic conductive film exposed to a laser beam.

23. The computing device of claim 22, wherein said computing device is a personal computer (PC).

24. The computing device of claim 22, wherein said computing device is a personal digital assistant (PDA).

25. The computing device of claim 22, wherein said computing device is a gaming system.

26. A portable media player comprising:
a processor:
a cache;
a user input component;
a coder-decoder component: and
a memory comprising:
a flash memory comprising:
a first substrate having a first via hole;
an anisotropic conductive film provided on the first substrate;
a second substrate having a second via hole provided on the anisotropic conductive film; and
a wiring pattern for providing a conduction of the first via hole of the first substrate and the second via hole of the second substrate, the wiring pattern formed in a region of the anisotropic conductive film exposed to a laser beam.

27. The portable media player of claim 26, wherein said portable media player is a portable music player.

28. The portable media player of claim 26, wherein said portable media player is a portable video player.

29. A semiconductor device comprising:
a first substrate having a first via hole;
an anisotropic conductive film provided on the first substrate;
a second substrate having a second via hole provided on the anisotropic conductive film, the second via hole misaligned with the first via hole; and
a wiring pattern for providing a conduction of the first via hole of the first substrate and the second via hole of the second substrate, the wiring pattern formed in a region of the anisotropic conductive film exposed to a laser beam.

* * * * *